(12) United States Patent
Zhang et al.

(10) Patent No.: US 12,446,389 B2
(45) Date of Patent: Oct. 14, 2025

(54) TANDEM CELL, METHOD FOR PREPARING THE SAME, AND PHOTOVOLTAIC MODULE

(71) Applicants: JINKO SOLAR CO., LTD., Jiangxi (CN); ZHEJIANG JINKO SOLAR CO., LTD., Zhejiang (CN)

(72) Inventors: Yuanfang Zhang, Jiangxi (CN); Menglei Xu, Jiangxi (CN); Jie Yang, Jiangxi (CN); Xinyu Zhang, Jiangxi (CN)

(73) Assignees: ZHEJIANG JINKO SOLAR CO., LTD., Haining (CN); JINKO SOLAR CO., LTD., Jiangxi (CN)

( * ) Notice: Subject to any disclaimer, the term of this patent is extended or adjusted under 35 U.S.C. 154(b) by 67 days.

(21) Appl. No.: 18/487,958

(22) Filed: Oct. 16, 2023

(65) Prior Publication Data

US 2025/0048823 A1    Feb. 6, 2025

(30) Foreign Application Priority Data

Jul. 31, 2023   (CN) .......................... 202310953768.X

(51) Int. Cl.
*H10K 30/57*   (2023.01)
*H10K 39/10*   (2023.01)
(Continued)

(52) U.S. Cl.
CPC ............ *H10K 30/57* (2023.02); *H10K 39/10* (2023.02); *H10K 71/12* (2023.02); *H10K 71/164* (2023.02);
(Continued)

(58) Field of Classification Search
CPC ........ H10K 30/57; H10K 39/15; H10K 39/10; H10K 85/50
See application file for complete search history.

(56) References Cited

U.S. PATENT DOCUMENTS

2016/0190377 A1   6/2016   Green
2018/0158976 A1*  6/2018   Ahn .................. H10F 71/121
(Continued)

FOREIGN PATENT DOCUMENTS

CN    114447127 A    5/2022
CN    108604615 B    12/2022
(Continued)

OTHER PUBLICATIONS

Manzoor (Year: 2017).*
(Continued)

*Primary Examiner* — Sadie White
(74) *Attorney, Agent, or Firm* — USCH Law, PC

(57) ABSTRACT

The tandem cell includes a bottom cell including a substrate. The substrate has a first side and a second side, the first side has a first textured surface including at least one first protrusion structure. The bottom cell further includes a tunneling dielectric layer and a doped conductive layer. A surface of the doped conductive layer has a micro textured surface including at least one micro protrusion structure, and the micro protrusion structure is smaller than the first protrusion structure. The tandem cell further includes a composite layer conformal to the micro textured surface. The tandem cell further includes a top cell formed on the composite layer. The top cell includes a first transport layer, a perovskite substrate, a second transport layer, a transparent conductive layer, and an anti-reflection layer stacked sequentially. The first transport layer is conformal to the micro textured surface.

11 Claims, 5 Drawing Sheets

(51) Int. Cl.
*H10K 71/12* (2023.01)
*H10K 71/16* (2023.01)
*H10K 71/20* (2023.01)
*H10K 71/30* (2023.01)
*H10K 85/50* (2023.01)

(52) U.S. Cl.
CPC ........... *H10K 71/236* (2023.02); *H10K 71/30* (2023.02); *H10K 85/50* (2023.02)

(56) References Cited

U.S. PATENT DOCUMENTS

| | | | |
|---|---|---|---|
| 2018/0374977 A1* | 12/2018 | Geerligs | H10F 77/223 |
| 2020/0058819 A1* | 2/2020 | Kirner | H10F 77/122 |
| 2021/0126147 A1 | 4/2021 | Lee et al. | |
| 2021/0175450 A1 | 6/2021 | Kim et al. | |
| 2022/0209039 A1 | 6/2022 | Lee et al. | |

FOREIGN PATENT DOCUMENTS

| | | |
|---|---|---|
| CN | 115623798 A | 1/2023 |
| CN | 115832107 A | 3/2023 |
| EP | 3633736 A1 | 4/2020 |
| EP | 3902019 A1 | 10/2021 |
| JP | 2015032736 A | 2/2015 |
| JP | 2018518845 A | 7/2018 |
| JP | 2019009402 A | 1/2019 |
| JP | 2022545188 A | 10/2022 |
| JP | 7378097 B2 | 11/2023 |
| WO | 2020204823 A1 | 10/2020 |

OTHER PUBLICATIONS

Zheng (Year: 2023).*
Jinko Solar Co., Ltd., et al., Extended European Search Report, EP 23203500.6, Apr. 4, 2024, 5 pgs.
Philipp Tockhorn, et al., "Nano-optical designs for high-efficiency monolithic perovskite-silicon tandem solar cells", Nature Nanotechnology, Oct. 24, 2022, 11 pgs.

* cited by examiner

TANDEM CELL, METHOD FOR PREPARING THE SAME, AND PHOTOVOLTAIC MODULE

CROSS-REFERENCE TO RELATED APPLICATION

The present application claims the benefit of priority under the Paris Convention to Chinese Patent Application No. 202310953768.X filed on Jul. 31, 2023, which is incorporated herein by reference in its entirety.

TECHNICAL FIELD

Embodiments of the present application relate to the technical field of photovoltaics, and in particular to a tandem cell, a method for preparing the same, and a photovoltaic module.

BACKGROUND

Currently, with the gradual depletion of fossil fuels, solar cells are becoming increasingly widely used as a new energy alternative. A solar cell is a device that converts the light energy of the sun into electrical energy. The solar cell uses the photovoltaic effect to generate carriers, which are then extracted using electrodes to be effectively utilized as electrical energy.

In the conventional art, the solar cell mainly includes a single-layer cell, such as an interdigitated back contact (IBC) cell, a tunnel oxide passivated contact (TOPCON) cell, a passivated emitter and rear cell (PERC), a heterojunction technology (HIT/HJT) cell, and a perovskite cell. By providing different film layers and functional limitations to reduce optical loss and reduce the recombination of photo generated carriers on the surface and inside a silicon substrate, so that the photovoltaic conversion efficiency of the solar cell can be improved.

In research, it was found that the perovskite cell has a semi-transparent characteristic, which means that photons can pass through the perovskite cell. That is, photovoltaic cells can be added to below the perovskite cell, thereby breaking the limit of single junction efficiency through "stacking", that is, a tandem cell. The principle of the tandem cell is that a top cell with a wide bandgap absorbs high-energy photons, while a bottom cell with a narrow bandgap improves photon utilization. The combination of the top cell and the bottom cell can break through the theoretical efficiency limit of single junction cell and further improve the conversion efficiency. However, it is found in research that the optical loss of the tandem cell is significant, resulting in poor cell efficiency.

SUMMARY

A tandem cell, a method for preparing the same, and a photovoltaic module are provided according to the embodiments of the present application, which are at least beneficial for improving the cell efficiency of the tandem cell.

According to some embodiments of the present application, in a first aspect, a tandem cell is provided according to the present application, the tandem cell includes a bottom cell, where the bottom cell includes a substrate. The substrate has a first side and a second side opposite to the first side, the first side has a first textured surface, and the first textured surface includes at least one first protrusion structure. The bottom cell further includes a tunneling dielectric layer formed on the second side, and a doped conductive layer formed on a surface of the tunneling dielectric layer away from the substrate. A surface of the doped conductive layer away from the tunneling dielectric layer has a micro textured surface, the micro textured surface includes at least one micro protrusion structure, and the at least one micro protrusion structure is smaller than the at least one first protrusion structure. The tandem cell further includes a composite layer formed on a surface of the doped conductive layer away from the tunneling dielectric layer. The composite layer is conformal to the micro textured surface. The tandem cell further includes a top cell formed on a surface of the composite layer away from the doped conductive layer. The top cell includes a first transport layer, a perovskite substrate, a second transport layer, a transparent conductive layer, and an anti-reflection layer stacked sequentially in the order recited. The first transport layer is formed between the composite layer and the perovskite substrate, and the first transport layer is conformal to the micro textured surface.

In some embodiments, a first side field is formed on a surface of the perovskite substrate away from the first transport layer, and the first side field has a smaller roughness than the micro textured surface.

In some embodiments, a second textured surface is formed on a surface of the transparent conductive layer away from the second transport layer, the second textured surface includes at least one second protrusion structure, and the at least one second protrusion structure is larger than the at least one micro protrusion structure.

In some embodiments, the second protrusion structure has a size of 100 nm to 10 μm.

In some embodiments, the first side field includes a flat surface.

In some embodiments, the perovskite substrate, the second transport layer, the transparent conductive layer, and the anti-reflection layer are conformal to the micro textured surface, respectively.

In some embodiments, the at least one micro protrusion structure has a size less than 1 μm.

In some embodiments, the at least one micro protrusion structure has a pyramid shape, a sinusoidal curve shape, or a parabolic shape.

In some embodiments, the composite layer includes a transparent conductive oxide (TCO) layer, a thin metal layer, and a polymer conductive layer.

In some embodiments, the second side has a third textured surface, and the tunneling dielectric layer is conformal to the third textured surface.

According to some embodiments of the present application, in a second aspect, a method for preparing a tandem cell is further provided according to the present application, the method includes providing a bottom cell, where the bottom cell includes a substrate. The substrate has a first side and a second side opposite to the first side, the first side has a first textured surface, and the first textured surface includes at least one first protrusion structure. The bottom cell further includes a tunneling dielectric layer arranged on the second side, and a doped conductive layer arranged on a surface of the tunneling dielectric layer away from the substrate. A surface of the doped conductive layer away from the tunneling dielectric layer has a micro textured surface, the micro textured surface includes at least one micro protrusion structure, and the at least one micro protrusion structure is smaller than the at least one first protrusion structure. The method further includes forming a composite layer on a surface of the doped conductive layer away from the tunneling dielectric layer. The composite layer is conformal to the micro textured surface. The method further includes forming a top cell on a surface of the composite layer away from the doped conductive layer.

In some embodiments, forming the top cell on the surface of the composite layer away from the doped conductive layer includes: forming a first transport layer on a surface of the composite layer away from the doped conductive layer, forming a perovskite substrate by physical evaporation plating on a surface of the first transport layer away from the composite layer, and forming a second transport layer, a transparent conductive layer, and an anti-reflection layer sequentially in the order recited. The second transport layer is formed on a surface of the perovskite substrate away from the first transport layer. The first transport layer, the perovskite substrate, the second transport layer, the transparent conductive layer, and the anti-reflection layer form the top cell together. The first transport layer, the perovskite substrate, the second transport layer, the transparent conductive layer, and the anti-reflection layer are conformal to the micro textured surface, respectively.

In some embodiments, forming the top cell on the surface of the composite layer away from the doped conductive layer includes: forming a first transport layer on the surface of the composite layer away from the doped conductive layer, forming a perovskite substrate by coating on a surface of the first transport layer away from the composite layer, and forming a second transport layer, a transparent conductive layer, and an anti-reflection layer sequentially in the order recited. The second transport layer is formed on a surface of the perovskite substrate away from the first transport layer. The first transport layer, the perovskite substrate, the second transport layer, the transparent conductive layer, and the anti-reflection layer form the top cell together, and the first transport layer is conformal to the micro textured surface. A first side field is formed on a surface of the perovskite substrate away from the first transport layer, and the first side field has a smaller roughness than the micro textured surface.

In some embodiments, forming the transparent conductive layer includes: forming a preset film layer on a surface of the second transport layer away from the perovskite substrate, and performing an etching treatment on the preset film layer to form a second textured surface on a surface of the preset film layer away from the second transport layer. The second textured surface includes at least one second protrusion structure, the at least one second protrusion structure is larger than the at least one micro protrusion structure, and remaining preset film layer serves as the transparent conductive layer.

In some embodiments, the etching treatment includes laser transfer printing or nanoimprinting.

In some embodiments, forming the doped conductive layer includes: forming a doped conductive film on a surface of the tunneling dielectric layer away from the substrate, and performing an etching process on the doped conductive film to form the micro textured surface. Remaining doped conductive film serves as the doped conductive layer.

In some embodiments, the etching process includes a solution etching process and a laser etching process.

According to some embodiments of the present application, in a third aspect, a photovoltaic module is further provided according to the present application, the photovoltaic module includes: at least one cell string formed by connecting multiple tandem cells according to any one of above embodiments in the first aspect or multiple tandem cells prepared by the method for preparing a tandem cell according to any one of above embodiments in the second aspect. The photovoltaic module further includes at least one encapsulation layer configured to cover the at least one cell string, and at least one cover plate configured to cover the at least one encapsulation layer.

BRIEF DESCRIPTION OF THE DRAWINGS

One or more embodiments are described as examples with reference to the corresponding figures in the accompanying drawings, and the exemplary description does not constitute a limitation to the embodiments. The figures in the accompanying drawings do not constitute a proportion limitation unless otherwise stated. For more clearly illustrating embodiments of the present disclosure or the technical solutions in the conventional technology, drawings referred to for describing the embodiments or the conventional technology will be briefly described hereinafter. Apparently, drawings in the following description are only examples of the present disclosure, and for the person skilled in the art, other drawings may be acquired based on the provided drawings without any creative efforts.

DETAILED DESCRIPTION

Figure 1:
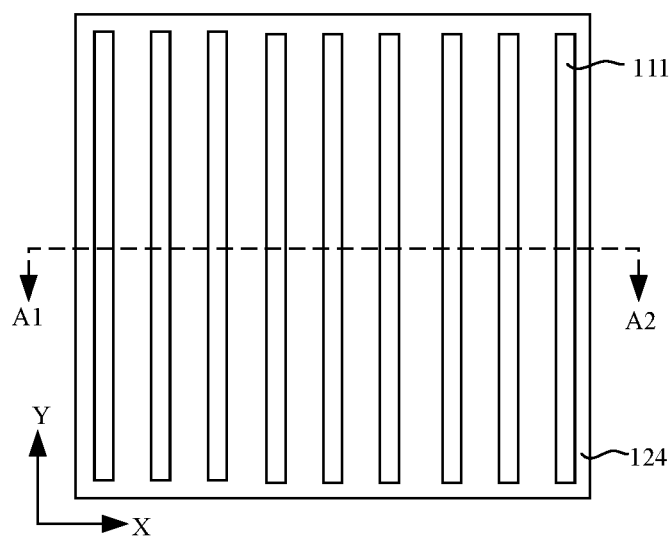
FIG. 1 is a top view of a tandem cell provided according to an embodiment of the present application.

It can be seen from the background technology that the tandem cell in the conventional art has poor cell efficiency.

A tandem cell, a method for preparing the tandem cell, and a photovoltaic module are provided according to the embodiments of the present application. The tandem cell includes a bottom cell, a composite layer, and a top cell. The bottom cell includes a substrate, a tunneling dielectric layer and a doped conductive layer. The first side of the substrate is provided with a first textured surface, which includes at least one first protrusion structure. The surface of the doped conductive layer away from the tunneling dielectric layer has a micro textured surface, and the micro textured surface includes at least one micro protrusion structure. The at least one micro protrusion structure is smaller than the at least one first protrusion structure. In this way, both the first protrusion structure and the micro textured surface have surfaces with protrusions and recesses, which can increase the reflection of light, thereby improving the utilization rate of light. Since the micro protrusion structure is smaller than the first protrusion structure, it can be explained that the overall size of the micro protrusion structure on the surface of the doped conductive layer is smaller compared to the structure in the conventional art. During the formation of the composite layer and the top cell, the micro textured surface can be transferred and conformally transformed, thereby improving the yield of the tandem cell. In addition, the micro protrusion structure also means that there is no need for a high height and large space to achieve the micro protrusion structure, so that there are still some film layers of the top cell between the doped conductive layer and the top electrode while the composite layer and top cell arranged on the micro protrusion structure being thinner, thereby avoiding the failure of the top cell caused by short circuit between the doped conductive layer and the top electrode.

Moreover, the micro protrusion structure represents a relatively small surface roughness of the doped conductive layer, so that the composite layer arranged on the doped conductive layer and the top cell are not only arranged on protrusions, but also on recesses, which reduces minority recombination and ensures the uniformity of films in the top cell, thereby ensuring the open circuit voltage and filling factor.

The embodiments of the present application will be described in detail below with reference to the accompanying drawings. However, those of ordinary skill in the art can understand that, in various embodiment of the present application, many technical details are set forth in order to provide the reader with a better understanding of the present application. However, the technical solutions claimed in the present application may be realized even without these technical details and various changes and modifications based on the following embodiments.

Figure 2:
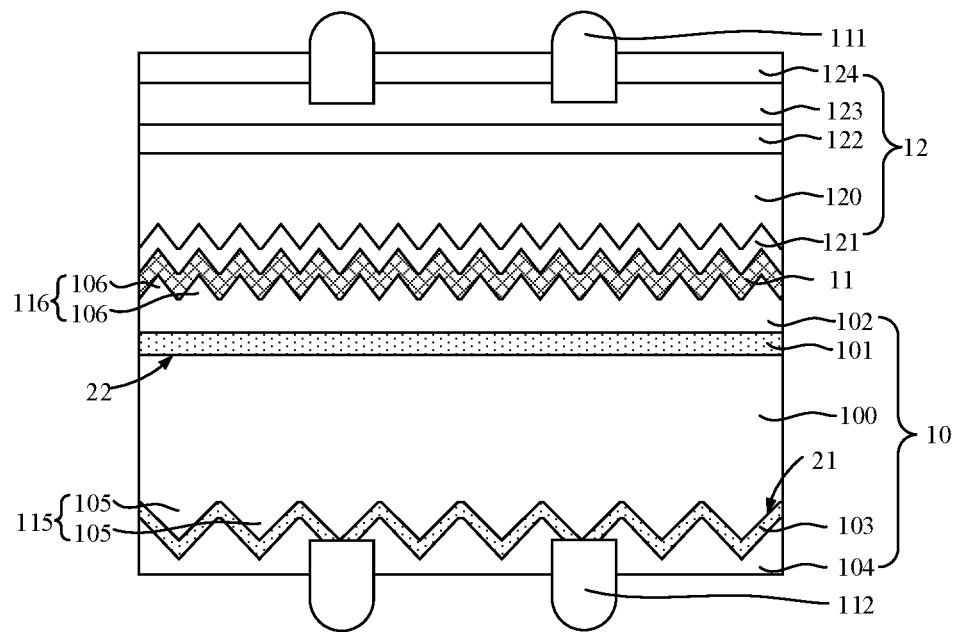
FIG. 2 is a first cross-sectional view of the solar cell shown in FIG. 1 along the A1-A2.
Figure 3:
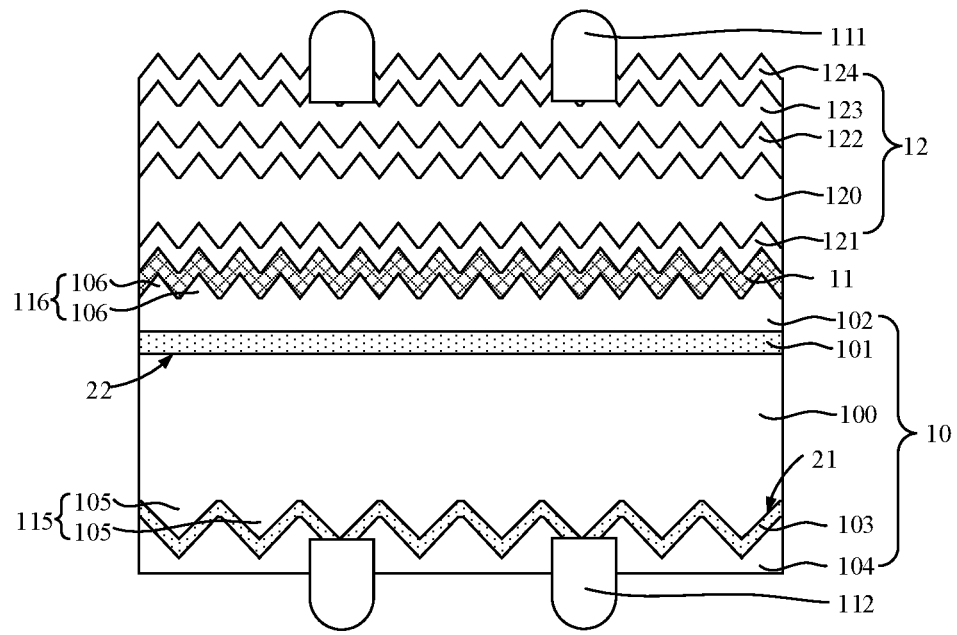
FIG. 3 is a second cross-sectional view of the solar cell shown in FIG. 1 along the A1-A2.
Figure 4:
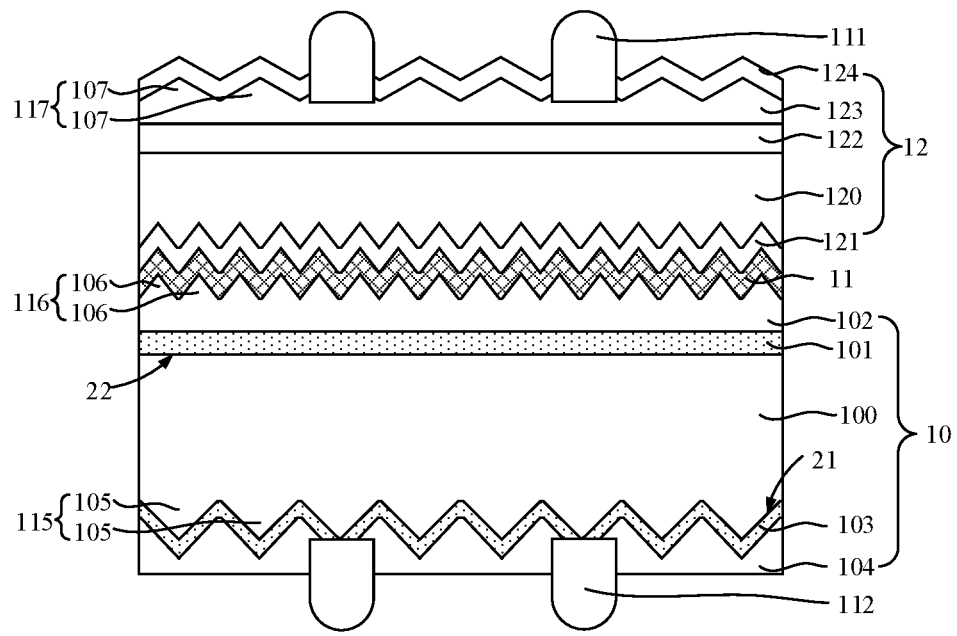
FIG. 4 is a third cross-sectional view of the solar cell shown in FIG. 1 along the A1-A2.
Figure 5:
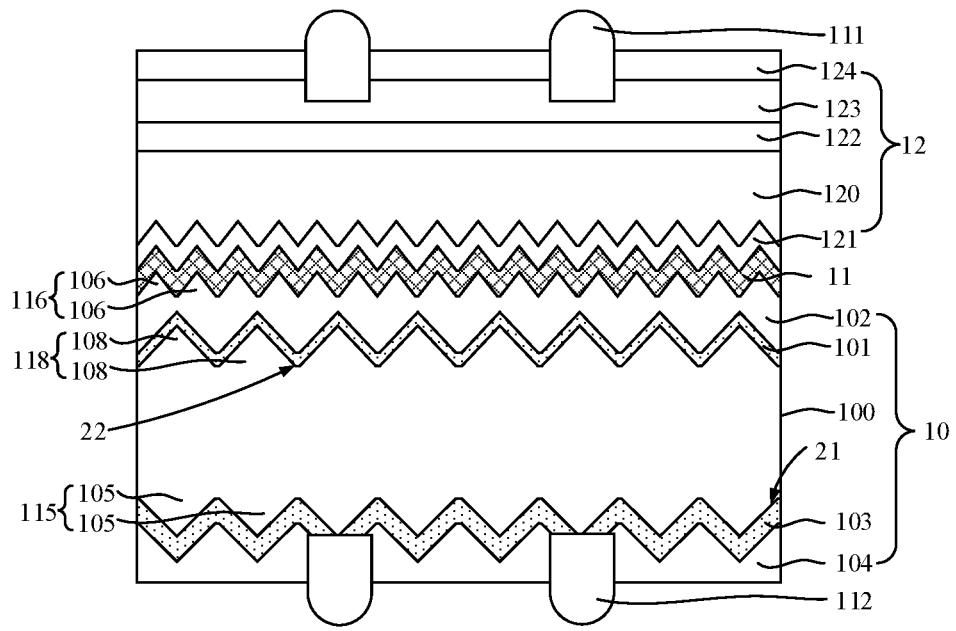
FIG. 5 is a fourth cross-sectional view of the solar cell shown in FIG. 1 along the A1-A2.
Figure 6:
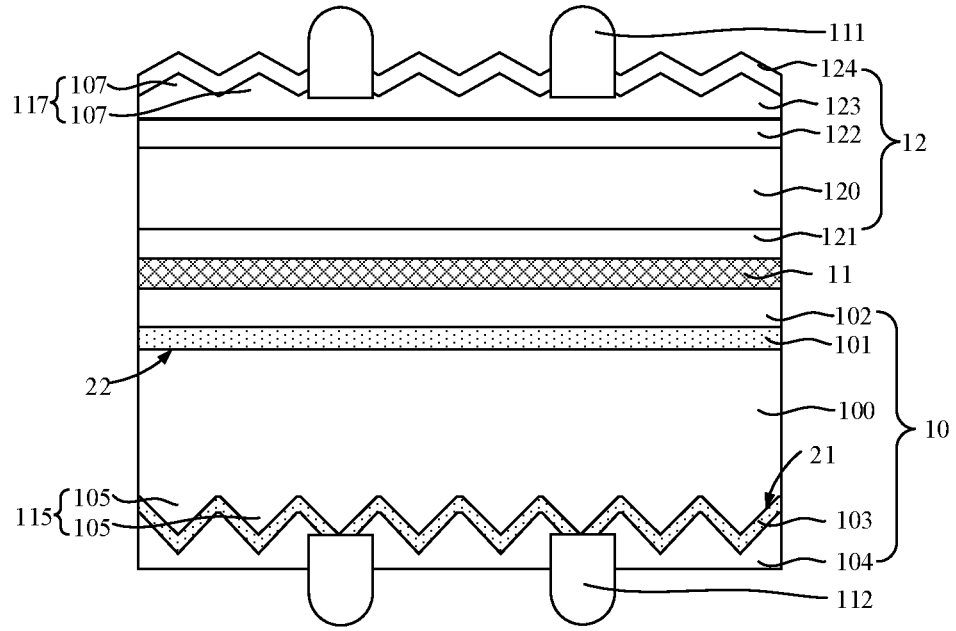
FIG. 6 is a fifth cross-sectional view of the solar cell shown in FIG. 1 along the A1-A2.

FIG. 1 is a top view of a tandem cell provided according to an embodiment of the present application. FIG. 2 is a first cross-sectional view of the solar cell shown in FIG. 1 along the A1-A2. FIG. 3 is a second cross-sectional view of the solar cell shown in FIG. 1 along the A1-A2. FIG. 4 is a third cross-sectional view of the solar cell shown in FIG. 1 along the A1-A2. FIG. 5 is a fourth cross-sectional view of the solar cell shown in FIG. 1 along the A1-A2. FIG. 6 is a fifth cross-sectional view of the solar cell shown in FIG. 1 along the A1-A2.

Referring to FIG. 1 and FIG. 2, according to some embodiments of the present application, in a first aspect, a tandem cell is provided according to the present application, the tandem cell includes a bottom cell 10, a composite layer 11, and a top cell 12.

In some embodiments, the bottom cell 10 or the top cell 12 may be any of a PERC cell, a passivated emitter and rear totally-diffused (PERT) cell, a TOPCon cell, or a HIT/HJT cell.

In some embodiments, the bottom cell 10 or top cell 12 may be a monocrystalline silicon solar cell, a polycrystalline a silicon solar cell, an amorphous silicon solar cell, or a multicomponent compound solar cell. The multicomponent compound solar cell may be specifically embodied as a cadmium sulfide solar cell, a gallium arsenide solar cell, a copper indium diselenide solar cell, or a perovskite solar cell.

In the embodiments of the present application, the bottom cell 10 is embodied as the TOPCon cell, and the top cell 12 is embodied as the perovskite cell.

Referring to FIG. 1, the bottom cell 10 includes a substrate 100, which has a first side 21 and a second side 22 opposite to the first side 21. The first side 21 has a first textured surface 115, and the first textured surface 115 includes at least one first protrusion structure 105. The bottom cell 10 includes a tunneling dielectric layer 101 arranged on the second side 22. The bottom cell 10 includes: a doped conductive layer 102 arranged on the surface of the tunneling dielectric layer 101 away from the substrate 100.

The doped conductive layer 102 has a micro textured surface 116 on a surface away from the tunneling dielectric layer 101. The micro textured surface 116 includes at least one micro protrusion structure 106, and the at least one the micro protrusion structure 106 is smaller than the at least one first protrusion structure 105. In this way, both the first protrusion structure 105 and the micro textured surface 116 have surfaces with protrusions and recesses, which can increase the reflection of light, thereby improving the utilization rate of light. Since the micro protrusion structure 106 is smaller than the first protrusion structure 105, it can be explained that the overall size of the micro protrusion structure 106 on the surface of the doped conductive layer 102 is smaller compared to the structure in the conventional art. During the formation of the composite layer 11 and the top cell 12, the micro textured surface 116 can be transferred and conformally transformed, thereby improving the yield of the tandem cell. In addition, the micro protrusion structure 106 also means that there is no need for a high height and large space to achieve the micro protrusion structure 106, so that there are still some film layers of the top cell 12 between the doped conductive layer 102 and the top electrode 111 while the composite layer 11 and top cell 12 arranged on the micro protrusion structure 106 being thinner, thereby avoiding the failure of the top cell 12 caused by short circuit between the doped conductive layer 102 and the top electrode 111.

Moreover, the micro protrusion structure 106 represents a relatively small surface roughness of the doped conductive layer 102, so that the composite layer 11 arranged on the doped conductive layer 102 and the top cell 12 are not only arranged on protrusions, but also on recesses, which reduces minority recombination and ensures the uniformity of films in the top cell 12, thereby ensuring the open circuit voltage and filling factor.

In some embodiments, the material of the substrate 100 may be an elemental semiconductor material. Specifically, elemental semiconductor materials are composed of a single element, such as silicon. Among them, the element semiconductor material may be in a single crystal state, a polycrystalline state, an amorphous state, or a microcrystalline state (with both single crystal and amorphous states, referred to as microcrystalline state), for example, silicon may be at least one of monocrystalline silicon, polycrystalline silicon, amorphous silicon, or microcrystalline silicon.

In some embodiments, the material of the substrate 100 may also be a compound semiconductor material. Common compound semiconductor materials include but are not limited to materials such as silicon germanide, silicon carbide, gallium arsenide, indium gallide, perovskite, cadmium telluride, copper indium selenium, etc. The substrate 100 may also be a sapphire substrate, a silicon substrate on an insulator, or a germanium substrate on an insulator.

In some embodiments, the substrate 100 may be an N-type semiconductor substrate or a P-type semiconductor substrate. The N-type semiconductor substrate is doped with N-type doping elements, which can be any of the V group elements such as phosphorus (P), bismuth (Bi), antimony (Sb), or arsenic (As). The P-type semiconductor substrate is doped with P-type elements, which can be any of the III group elements such as boron (B), aluminum (Al), gallium (Ga), or gallium (In).

In some embodiments, the first side 21 and the second side 22 of the substrate 100 are both serve as light receiving surfaces for receiving incident light.

In some embodiments, the original textured surface 115 includes a regular shaped pyramid textured surface and irregularly shaped black silicon, a shape composed of multiple parabolic strips, and a shape composed of multiple grooves. The inclined surface or side surface of the original textured surface 115 can increase the internal reflection of incident light, which improves the absorption and utilization of incident light by the substrate 100, thereby improving the cell efficiency of the substrate 10.

In some embodiments, the original textured surface 115 includes at least one first protrusion structure 105. The at least one first protrusion structure 105 is provided within any arrangement, height and size range known to those skilled in the art, which will not be limited thereto the embodiments of the present application.

The definition of the size of a protrusion structure refers to randomly specifying a certain area within the surface of the substrate, the one-dimensional size of the bottom surface of each first protrusion structure 105 within this area is measured, the average value of the measured size is defined as the size of a protrusion structure. It can be seen that the size of a protrusion structure refers to the range of average values in an area, not all ranges of sizes of the first protrusion structure 105 within the substrate, and all ranges of dimensions of the first protrusion structure 105 are generally greater than the range of average values. As an example, the morphology of each first protrusion structure 105 in FIG. 2 is the same, so that the size of the first protrusion structure equals to the average one-dimensional size.

It is worth noting that one-dimensional dimensions refer to the distance between two diagonals in the bottom shape of the first protrusion structure. In some embodiments, the one-dimensional dimension may also be defined as the distance between the two sides of the bottom shape. Among them, multiple surfaces of the at least one first protrusion structures away from the first side 21 are fitted to construct a virtual surface as the bottom surface, that is, the bottom surface is a simulated surface, and does not exist in actual cells. For example, one part of surfaces of the at least one first protrusion structure away from the first side are flush with the bottom surface, and the other part of surfaces of the at least one first protrusion structure away from the first side are higher or lower than the bottom surface, all of which comply with the original textured surface 115 included in the embodiments of the present application.

In some embodiments, the first protrusion structure 105 has a size of 100 nm to 10 µm, such as 100 nm to 300 nm, 300 nm to 600 nm, 600 nm to 1000 nm, 1 µm to 2 µm, 2 µm to 4 µm, 4 µm to 7 µm, or 7 µm to 10 µm. The first protruding structure 105 has a height of 100 nm to 10 µm, such as 100 nm to 450 nm, 450 nm to 700 nm, 700 nm to 1700 nm, 1.7 µm to 3.2 µm, 3.2 µm to 6.1 µm, 6.1 µm to 8.5 µm, or 8.5 µm to 10 µm. The size of the first protrusion structure 105 within the above range can ensure that the defects on the first side 21 of the substrate 100 are small, and the inclined surface of the first protrusion structure 105 can reflect incident light multiple times, thereby improving the utilization rate of light. In addition, the height of the first protrusion structure 105 refers to the vertical distance between the highest point of the first protrusion structure 105 away from the second side 22 and the bottom surface.

In some embodiments, the doped conductive layer 102 can form energy band bending on the surface of substrate 100, and the tunneling dielectric layer 101 causes an asymmetric shift in the energy band on the surface of substrate 100, resulting in a lower barrier for majority carriers in carriers than for minority carriers in carriers. Therefore, the majority carriers can easily undergo quantum tunneling through the tunneling dielectric layer 101, However, the minority carriers are difficult to undergo through the tunneling dielectric layer 101 to achieve selective carrier transport.

In addition, the tunneling dielectric layer 101 has a chemical passivation effect. Due to the presence of interface state defects at the interface between the substrate 100 and the tunneling dielectric layer 101, the interface state density on the rear surface of the substrate 100 is relatively high. An increase in the interface state density will promote the recombination of photo generated carriers, which increases the filling factor, the short-circuit current, and the open circuit voltage of the solar cell, thereby improving the photovoltaic conversion efficiency of the solar cell. The tunneling dielectric layer 101 is arranged on the surface of the substrate 100, so that the tunneling dielectric layer 101 has a chemical passivation effect on the surface of the substrate 100. Specifically, by saturating the hanging bonds of the substrate 100, the defect state density of the substrate 100 is reduced, and the recombination center of the substrate 100 is reduced to reduce the carrier recombination rate.

In some embodiments, the material of the tunneling dielectric layer 101 includes at least one of silicon oxide, silicon nitride, silicon nitride, silicon carbide, or magnesium fluoride.

The doping conductive layer 102 achieves field passivation effect. Specifically, an electrostatic field directed towards the interior of the substrate 100 is formed on the surface of the substrate 100, which causes minority carriers to escape from the interface, reduces the concentration of minority carriers, and reduces the recombination rate of carriers at the interface of the substrate 100, thereby increasing the open circuit voltage, the short circuit current, and the filling factor of the solar cell, and improving the photoelectric conversion efficiency of the solar cell.

The material of the doped with conductive layer 102 includes at least one of amorphous silicon, polycrystalline silicon, or silicon carbide.

The doped conductive layer 102 may be doped with doping elements of the same type as the substrate 100. For example, in response to the doping element type of the substrate 100 being P-type, the doping element type inside the doped conductive layer 102 is also P-type. In response to the doping element type of the substrate 100 being N-type, the doping element type inside the doped conductive layer 102 is N-type.

The doped conductive layer 102 has a greater doping element concentration than the substrate 100, in order to form a sufficiently high potential barrier on the rear surface of the substrate 100, which allows the majority carriers in the substrate 100 to undergo through the tunneling dielectric layer 101 to the doped conductive layer 102.

In some embodiments, the at least one micro protrusion structure 106 has a pyramid shape, a sinusoidal curve shape, or a parabolic shape.

It is worth noting that the definition of the size of the micro protrusion structure 106 is the same as the definition of the size of the first protrusion structure 105, which will not be repeated here.

In some embodiments, the size of the micro protrusion structure 106 is less than 1 µm. The size of the micro protrusion structure 106 is less than 890 nm. The size of the micro protrusion structure 106 is less than 760 nm. The size of the micro protrusion structure 106 is less than 620 nm. The size of the micro protrusion structure 106 is less than 500 nm. The size of the micro protrusion structure 106 is less than 320 nm. In this way, in response to the size of the micro protrusion structure 106 falls within any of the above ranges, the size of the micro protrusion structure 106 is relatively small, the etching time and etching degree of the doped conductive layer 102 are smaller, which avoids significant etching losses on the doped conductive layer 102 and ensures good passivation effect of the doped conductive layer 102.

In some embodiments, the height of the micro protrusion structure 106 is less than 1 μm. The height of the micro protrusion structure 106 is less than 910 nm. The height of the micro protrusion structure 106 is less than 810 nm. The height of the micro protrusion structure 106 is less than 590 nm. The height of the micro protrusion structure 106 is less than 430 nm. The height of the micro protrusion structure 106 is less than 220 nm. In this way, in response to the height of the micro protrusion structure 106 falls within any of the above ranges, the height of the micro protrusion structure 106 is relatively small, and the roughness of the micro protrusion structure 106 is small. The composite layer 11 is not only arranged on protrusions of the micro protrusion structure 106, but also on recesses of the micro protrusion structure 106, thus providing a better interface composite effect. Among them, the height of the micro protrusion structure 106 refers to the vertical distance between the highest point of the micro protrusion structure 106 away from the first side 21 and the bottom surface.

In addition, in the height and size of the micro protrusion structure 106 being within the above ranges, the micro protrusion structure 106 has a large aspect ratio. The inclined surface of the micro protrusion structure 106 can reflect incident light multiple times, thereby improving the utilization rate of light.

The composite layer 11 is arranged on a surface of doped conductive layer 102 away from the tunneling dielectric layer 101. The composite layer 11 is conformal to the micro textured surface 116, thereby retaining the micro textured surface 116 of the doped conductive layer 102, ensuring the trapping efficiency and ensuring the photoelectric conversion efficiency of the tandem cell.

In some embodiments, the composite layer 11 includes a TCO layer, a thin metal layer, and a polymer conductive layer. The TCO layer may be an indium tin oxide (ITO) layer, an aluminum doped zinc oxide (AZO) layer, a fluorine doped tin oxide (FTO) layer, or an antimony doped tin oxide (ATO) layer. The material of the thin metal layer may be aluminum, gold, or silver. The polymer conductive layer includes polypyrrole, polyaniline, or polythiophene.

It is worth noting that conformal refers to having the same shape. Specifically, a surface of the composite layer 11 away from the doped conductive layer 102 has the same textured surface as the micro textured surface 116.

The top cell 12 arranged on a surface of the composite layer 11 away from the doped conductive layer 102. The top cell 12 includes a first transport layer 121, a perovskite substrate 120, a second transport layer 122, a transparent conductive layer 123, and an anti-reflection layer 124 stacked sequentially in the order recited. The first transport layer 121 is arranged between the composite layer 11 and the perovskite substrate 120. The first transport layer 121 is conformal to the micro textured surface 116.

In some embodiments, the first side field is formed on a surface of the perovskite substrate 120 away from the first transport layer 121, and the roughness of the first side field is smaller than that of the micro textured surface 116. For example, the first side field includes a flat surface, the uniformity of the second transport layer 122, transparent conductive layer 123, and anti-reflection layer 124 deposited on the perovskite substrate 120 is better.

In some embodiments, the first transport layer 121 is one of an electron transport layer or a hole transport layer, and the second transport layer 122 is the other of the electron transport layer or the hole transport layer.

In some embodiments, the electron transport layer includes materials such as tin oxide SnOx, titanium dioxide TiO2, C60, and PCBM, including fullerenes and their derivatives. The hole transport layer includes materials such as poly (bis (4-phenyl) (2,4,6-trimethylphenyl) amine) (PTAA), 2, 2', 7, 7'-tetra [N, N-bis (4-methoxyphenyl) amino]-9,9'-spiro OMeTAD, nickel oxide (NiOx), or cuprous thiocyanide (CuSCN).

In some embodiments, the thickness of the first transport layer 121 has a thickness of 1 nm to 1 μm along the first direction.

The first transport layer 121 is main provided to improve the collection and transmission ability of one type of carrier, while isolating the contact between another type of carrier and the composite layer 11. Therefore, in response to the thickness of the first transport layer 121 along the first direction being too large, the migration distance of carriers during the transfer to the composite layer 11 is too large, which leads to carrier recombination, significant carrier loss, and a decrease in the photovoltaic conversion efficiency of the solar cell. In response to the thickness of the first transport layer 121 along the first direction being too small, the ability of the first transport layer 121 to collect and transport carriers is limited, and it may not be able to timely collect and transport all types of carriers generated by the perovskite substrate 120, resulting in significant carrier loss, and thereby affecting the photovoltaic conversion efficiency of the solar cell. In addition, in response to the thickness of the first transport layer 121 along the first direction being too small, there will also be a certain decrease in the isolation ability of another type of carrier, which may lead to the recombination of different types of carriers, thereby further affecting the photoelectric conversion efficiency of the solar cell.

Therefore, during the formation of the first transport layer 121, the thickness of the first transport layer 121 along the first direction is set between 1 nm to 1 μm, such as 1 nm, 5 nm, 10 nm, 50 nm, 100 nm, 200 nm, 250 nm, 400 nm, 500 nm, 650 nm, 750 nm, 800 nm, or 950 nm, which ensures that the first transport layer 121 has sufficient aggregation and transmission capacity for one type of carrier, as well as sufficient isolation capacity for another type of carrier, and reduces carrier losses caused by carrier recombination and migration, thereby ensuring the photoelectric conversion efficiency of the solar cell.

The second transport layer 122 is similar to the first transport layer 121 in that it collects and transports a type of carriers generated in the perovskite substrate 120. In response to the second transport layer 122 being an electron transport layer, the second transport layer 122 is configured to collect electrons, transmit the collected electrons to the corresponding transparent conductive layer 123, output electrical energy from the power supply electrode, and also block the holes from flowing directly to the transparent conductive layer 123. In response to the second transport layer 122 being a hole transport layer, the second transport layer 122 is configured to prevent electrons from entering the transparent conductive layer 123, enhances hole transport, prevent direct contact between the perovskite substrate 120 and the transparent conductive layer 123, so that the photoelectric conversion ability and electrical energy output of the solar cell are ensured.

In some embodiments, the second transport layer 122 has thickness of 1 nm to 1 μm along the first direction.

The second transport layer 122 is mainly configured to improve the collection and transmission ability of one type of carrier, while isolating the contact between another type of carrier and the transparent conductive layer 123. Therefore, in response to the thickness of the second transport layer 122 along the first direction being too large, the migration distance of carriers during the transmission to the transparent conductive layer 123 is too large, which leads to carrier recombination, significant carrier loss and a decrease in the photovoltaic conversion efficiency of the solar cell. In response to the thickness of the second transport layer 122 along the first direction being too small, the ability of the second transport layer 122 to collect and transport carriers is limited, and it may not be able to collect and transport all types of carriers generated by the perovskite substrate 120 in time, resulting in significant carrier loss and thereby affecting the photovoltaic conversion efficiency of the solar cell. In addition, in response to the thickness of the second transport layer 122 along the first direction being too small, there will also be a certain decrease in the isolation ability of another type of carrier, which leads to the recombination of different types of carriers, further affecting the photoelectric conversion efficiency of the solar cell.

Therefore, during the formation of the second transport layer 122, the thickness of the second transport layer 122 along the first direction is set between 1 nm to 1 μm, such as 1 nm, 5 nm, 10 nm, 50 nm, 100 nm, 200 nm, 250 nm, 400 nm, 500 nm, 650 nm, 750 nm, 800 nm, or 950 nm, which ensures that the first transport layer 121 has sufficient aggregation and transmission capacity for one type of carrier, as well as sufficient isolation capacity for another type of carrier, and reduces carrier losses caused by carrier recombination and migration, thereby ensuring the photoelectric conversion efficiency of the solar cell.

In some embodiments, the transparent conductive layer 123 may be an ITO layer, an AZO layer, a FTO layer, or an ATO layer.

In some embodiments, the material of the transparent conductive layer 123 is a polymer transparent material such as polydimethylsiloxane (PDMS), and polymethyl methacrylate (PMMA).

In some embodiments, referring to FIG. 4, the transparent conductive layer 123 has a second textured surface on a surface away from the second transport layer 122. The second textured surface includes at least one second protrusion structure 107. The at least one second protrusion structure 107 is larger than the at least one micro protrusion structure 106. The second protrusion structure 107 is configured to increase the reflection of light, thereby improving the utilization rate of light.

In some embodiments, the second protrusion structure 107 has a size of 100 nm to 10 μm, such as 100 nm to 300 nm, 300 nm to 600 nm, 600 nm to 1000 nm, 1 μm to 2 μm, 2 μm to 4 μm, 4 μm to 7 μm, or 7 μm to 10 μm. The second protruding structure 107 has a height of 100 nm to 10 μm, such as 100 nm to 450 nm, 450 nm to 700 nm, 700 nm to 1700 nm, 1.7 μm to 3.2 μm, 3.2 μm to 6.1 μm, 6.1 μm to 8.5 μm, or 8.5 μm to 10 μm. By providing the second protrusion structure 107 within the above size and height ranges, the inclined surface of the second protrusion structure 107 is ensured to reflect incident light multiple times, thereby improving the utilization rate of light.

In some embodiments, the material of the anti-reflection layer 124 includes one or a combination of LiF, MgF2, AlN, ZnS, Si3N4, SiO2, TiO2, or a flexible film with a textured surface, and the anti-reflection layer 124 has a thickness of 0 to 3 mm.

In some embodiments, referring to FIG. 3, the perovskite substrate 120, the second transport layer 122, the transparent conductive layer 123, and the anti-reflection layer 124 are conformal to the micro textured surface 116, respectively.

In some embodiments, referring to FIG. 5, the second side 22 has a third textured surface 118, and the tunneling dielectric layer 101 is conformal to the third textured surface 118, which improves the internal reflection of light, and improves the utilization rate of light, and thereby improving the cell efficiency of the tandem cell. The third textured surface 118 includes multiple third protrusion structures 108, and the size of the third protrusion structure 108 is the same as that of the first protrusion structure 105.

Referring to FIG. 6, the second side 22 is a polished surface. The tunneling dielectric layer 101, the doped conductive layer 102, the composite layer 11, the first transport layer 121, the perovskite substrate 120, and the second transport layer 122 arranged on the second side 22 are conformal to the polished surface, which ensures good uniformity of each film layer and avoids short circuit and open circuit problems during cell transmission.

In addition, the first side 21 of the substrate 100 has an emitter 103 and a passivation layer 104. The emitter 103 has opposite type of doping elements to those in the substrate, which forms a PN junction with the substrate for transporting electrons and holes separately. The passivation layer 104 may be a single-layer structure or a stacked structure, and the material of the passivation layer 104 may be one or more of materials such as silicon oxide, silicon nitride, silicon nitride, carbon nitrogen oxide, titanium oxide, hafnium oxide, or aluminum oxide.

The tandem cell further includes a top electrode 111 and a bottom electrode 112. The top electrode 111 is configured to penetrate through the anti-reflection layer 124 to be in electrical contact with the transparent conductive layer 123. The bottom electrode 112 is configured to penetrate through the passivation layer 104 to be in electrical contact with the emitter 103.

In some embodiments, the top electrode 111 and the bottom electrode 112 are formed by sintering burn-through type slurry. The operation of forming the top electrode 111 and the bottom electrode 112 includes printing metal slurry on the surface of a part of the passivation layer 104 or the anti-reflection layer 124 by a screen-printing process. The metal slurry includes at least one of silver, copper, tin, gold, lead, or nickel. The sintering process is carried out on the metal slurry. In some embodiments, the metal slurry contains materials with high corrosive components such as glass. Therefore, during the sintering process, the corrosive components will corrode the passivation layer 104 or the anti-reflection layer 124, which causes the metal slurry to penetrate into the passivation layer 104 or the anti-reflection layer 124 to be in contact with the first side electric field.

In response to the passivation layer 104 including an aluminum oxide layer, a laser slotting process is performed first, followed by a screen-printing process to ensure electrical contact between the bottom electrode 112 and the emitter 103.

The tandem cell provided according to the embodiment of the present application includes the bottom cell 10, the composite layer 11, and the top cell 12. The bottom cell 11 includes the substrate 100, the tunneling dielectric layer 101 and the doped conductive layer 102. The first side of the substrate 100 is provided with a first textured surface, which includes at least one first protrusion structure 105. The surface of the doped conductive layer 102 away from the tunneling dielectric layer 101 has a micro textured surface 116, and the micro textured surface 116 includes at least one micro protrusion structure 106. The at least one micro protrusion structure 106 is smaller than the at least one first protrusion structure 105. In this way, both the first protrusion structure 105 and the micro textured surface 116 have surfaces with protrusions and recesses, which can increase the reflection of light, thereby improving the utilization rate of light. Since the micro protrusion structure 106 is smaller than the first protrusion structure 105, it can be explained that the overall size of the micro protrusion structure 106 on the surface of the doped conductive layer 102 is smaller compared to the structure in the conventional art. During the formation of the composite layer 11 and the top cell 12, the micro textured surface 116 can be transferred and conformally transformed, thereby improving the yield of the tandem cell. In addition, the micro protrusion structure 106 also means that there is no need for a high height and large space to achieve the micro protrusion structure 106, so that there are still some film layers of the top cell 12 between the doped conductive layer 102 and the top electrode 111 while the composite layer 11 and top cell 12 arranged on the micro protrusion structure 106 being thinner, thereby avoiding the failure of the top cell 12 caused by short circuit between the doped conductive layer 102 and the top electrode 111.

Moreover, the micro protrusion structure 106 represents a relatively small surface roughness of the doped conductive layer 102, so that the composite layer 11 arranged on the doped conductive layer 102 and the top cell 12 are not only arranged on protrusions, but also on recesses, which reduces minority recombination and ensures the uniformity of films in the top cell 12, thereby ensuring the open circuit voltage and filling factor.

Correspondingly, according to some embodiments of the present application, in the second aspect, a method for preparing the tandem cell is further provided according to the present application, and the method is used to prepare the tandem cell provided according to the above embodiments. The same or corresponding technical features as the above embodiments will not be repeated here.

Figure 7:
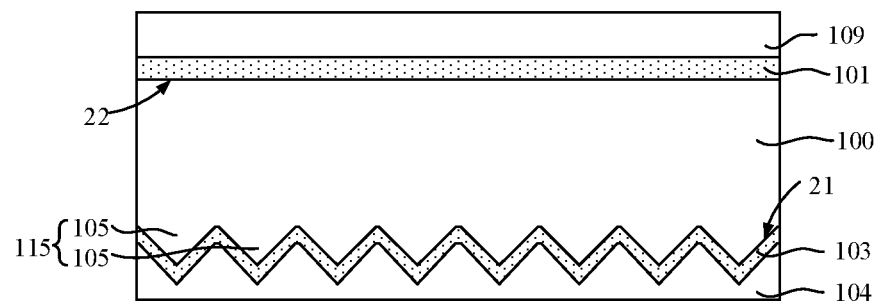
FIG. 7 to FIG. 9 are cross-sectional views of a tandem cell corresponding to each operation in the method for preparing the tandem cell provided according to an embodiment of the present application.
Figure 8:
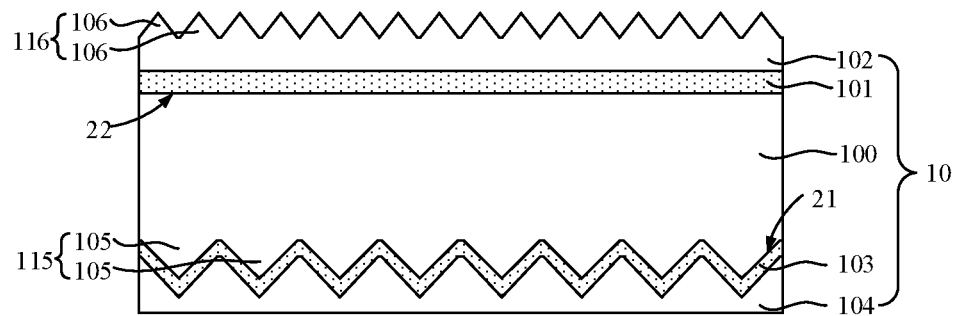

Referring to FIG. 7 to FIG. 8, a bottom cell 10 is provided, the bottom cell 10 includes a substrate 100, which has a first side 21 and a second side 22 opposite to the first side 21. The first side 21 has a first textured surface 115, and the first textured surface 115 includes at least one first protrusion structure 105. The bottom cell 10 includes a tunneling dielectric layer 101 arranged on the second side 22. The bottom cell 10 includes: a doped conductive layer 102 arranged on the surface of the tunneling dielectric layer 101 away from the substrate 100. The doped conductive layer 102 has a micro textured surface 116 on a surface away from the tunneling dielectric layer 101. The micro textured surface 116 includes at least one micro protrusion structure 106, and the at least one the micro protrusion structure 106 is smaller than the at least one first protrusion structure 105.

Reference of the operation of forming the bottom cell 10 is made to the conventional method of forming a TOPCon cell, which will not be detailed here. The simple operations include: providing a substrate 100, texturing on a first side and a second side of the substrate 100, diffusing the first side of the substrate 100 to form an emitter 103, polishing the second side of the substrate 100 to obtain a polished surface, forming a tunneling dielectric layer 101 and a doped conductive layer 102 on the polished surface, and forming a passivation layer 104 on a surface of the emitter 103 away from the substrate 100.

In some embodiments, referring to FIG. 7, a doped conductive film 109 is formed, which is arranged on a surface of the tunneling dielectric layer 101 away from the substrate 100.

Referring to FIG. 8, an etching process was performed on the doped conductive film 109 to obtain a micro textured surface 116, and remaining doped conductive film 109 serves as the doped conductive layer 102.

In some embodiments, the etching process includes a solution etching process and a laser etching process.

Figure 9:
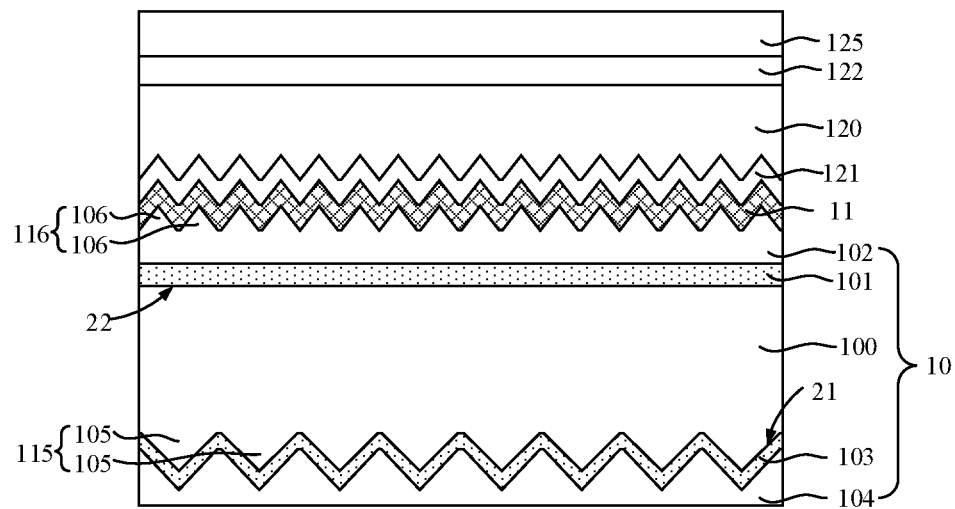

Referring to FIG. 9, a composite layer 11 is formed, which is arranged on a surface of the doped conductive layer 102 away from the tunneling dielectric layer 101. The composite layer 11 is conformal to the micro textured surface 116.

Figure 10:
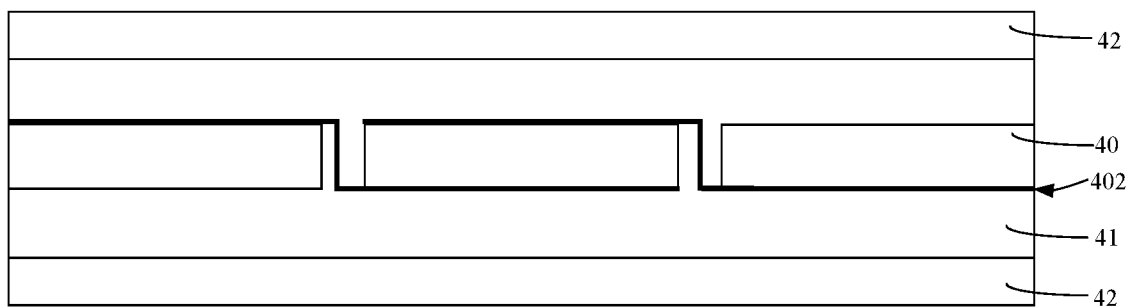
FIG. 10 is a cross-sectional view of a photovoltaic module provided according to an embodiment of the present application.

Referring to FIG. 10 and FIG. 2, a top cell 12 is formed, which is arranged on a surface of the composite layer 11 away from the doped conductive layer 102.

In some embodiments, the operation of forming the top cell 12 includes: forming a first transport layer 121 on a surface of the composite layer 11 away from the doped conductive layer 102, forming a perovskite substrate 120 by physical evaporation plating on a surface of the first transport layer 121 away from the composite layer 11, and forming a second transport layer 122, a transparent conductive layer 123, and an anti-reflection layer 124 sequentially in the order recited. The second transport layer 122 is formed on a surface of the perovskite substrate 120 away from the first transport layer 121. The first transport layer 121, the perovskite substrate 120, the second transport layer 122, the transparent conductive layer 123, and the anti-reflection layer 124 form the top cell 12 together. The first transport layer 121, the perovskite substrate 120, the second transport layer 122, the transparent conductive layer 123, and the anti-reflection layer 124 are conformal to the micro textured surface 116, respectively.

The physical evaporation plating refers to evaporating or sublimating substance to be filmed in a vacuum, so as to deposit the substance on the first transport layer 121. In addition, the uniformity of film layers deposited on the perovskite substrate 120 is desirable, and the shape of the film layers arranged on the first transport layer 121 can be copied or overprinted, thereby copying the micro textured surface 116 and increasing the utilization rate of light in the top cell 12 while not damaging the film characteristics of the top cell 12.

In some embodiments, an operation of forming the top cell 12 includes: forming a first transport layer 121 on the surface of the composite layer 11 away from the doped conductive layer 102, forming a perovskite substrate 120 by coating on a surface of the first transport layer 121 away from the composite layer 11, and forming a second transport layer 122, a transparent conductive layer 123, and an anti-reflection layer 124 sequentially in the order recited. The second transport layer 122 is formed on a surface of the perovskite substrate 120 away from the first transport layer 121. The first transport layer 121, the perovskite substrate 120, the second transport layer 122, the transparent conductive layer 123, and the anti-reflection layer 124 form the top cell 12 together, and the first transport layer 121 is conformal to the micro textured surface 116. A first side field is formed on a surface of the perovskite substrate 120 away from the first transport layer 121, and the first side field has a smaller roughness than the micro textured surface 116.

The coating refers to forming a layer of perovskite substrate 120 on the surface of the first transport layer 121 away from the composite layer 11 by spin coating, so that the first side field of the perovskite substrate 120 is a flat surface. Therefore, the uniformity of the second transport layer 122, the transparent conductive layer 123, and the anti-reflection layer 124 deposited on the perovskite substrate 120 is desirable.

In some embodiments, an operation of forming the transparent conductive layer 123 includes following suboperations. Referring to FIG. 9, a preset film layer is formed on a surface of the second transport layer 122 away from the perovskite substrate 120. Referring to FIG. 2, an etching treatment is performed on the preset film layer to form a second textured surface on a surface of the preset film layer away from the second transport layer 122. The second textured surface includes at least one second protrusion structure 107. The at least one second protrusion structure 107 is larger than the at least one micro protrusion structure 106. The remaining preset film layer serves as a transparent conductive layer 123.

In some embodiments, the etching treatment includes laser transfer printing or nanoimprinting.

Referring to FIG. 1, a reflection layer 124 is formed on a surface of the transparent conductive layer 123 away from the second transport layer 122.

Referring to FIG. 2, a bottom electrode 112 and a top electrode 111 are formed. The top electrode 111 penetrates through the anti-reflection layer 124 to be in electrical contact with the transparent conductive layer 123, and the bottom electrode 112 penetrates through the passivation layer 104 to be in electrical contact with the emitter 103.

FIG. 10 is a cross-sectional view of a photovoltaic module provided according to an embodiment of the present application.

Correspondingly, in the third aspect, a photovoltaic module is further provided according to the present application, referring to FIG. 10, the photovoltaic module includes: at least one cell string formed by connecting multiple tandem cells 40 according to any one of above embodiments in the first aspect or multiple tandem cells 40 prepared by the method for preparing a tandem cell according to any one of above embodiments in the second aspect. The photovoltaic module further includes at least one encapsulation layer 41 configured to cover the at least one cell string, and at least one cover plate 42 configured to cover the at least one encapsulation layer 41. Multiple tandem cells 40 are electrically connected in whole pieces or fragment pieces to form multiple cell strings. The multiple cell strings are electrically connected in series or parallel.

Specifically, in some embodiments, multiple cell strings are electrically connected by a conductive tape 402. FIG. 8 only illustrates the positional relationship between solar cells, where the electrodes with the same polarity are arranged in the same direction, or electrodes with positive polarity for each cell are arranged towards the same side, so that the conductive tape 402 is connected to different sides of two adjacent cells, respectively. In some embodiments, the cell cells can also be arranged in order of electrodes with different polarities facing the same side, that is, the electrodes of adjacent multiple cell cells are sorted in order of first polarity, second polarity, and first polarity, and the conductive tape 408 is connected to two adjacent cells on the same side.

In some embodiments, there is no distance between the solar cells, that is, the solar cells overlap with each other.

In some embodiments, the encapsulation layer 41 includes a first encapsulation layer and a second encapsulation layer. The first encapsulation layer is configured to cover one of a front surface or a rear surface of the solar cell 40, and the second encapsulation layer is configured to cover the other of a front surface or a rear surface of the solar cell 40. Specifically, at least one of the first encapsulation layer or the second encapsulation layer is an organic encapsulation adhesive film, such as polyvinyl butyral (PVB) adhesive film, ethylene vinyl acetate copolymer (EVA) film, polyethylene octene co elastomer (POE) film, or polyethylene terephthalate (PET) film.

It can be understood that there is a boundary line between the first encapsulation layer and the second encapsulation layer before lamination, and the concept of the first encapsulation layer and the second encapsulation layer will no longer exist in response to the photovoltaic module being formed after lamination treatment, that is, the first encapsulation layer and the second encapsulation layer have already formed an overall encapsulation layer 41.

In some embodiments, the at least one cover plate 42 may be a glass cover plate, a plastic cover plate, or other cover plates with light transmission function. Specifically, a surface of the at least one cover plate 42 facing the encapsulation layer 41 is a surface with protrusions and recesses, thereby increasing the utilization of incident light. The cover plate 42 includes a first cover plate and a second cover plate. The first cover plate faces toward the first encapsulation layer, and the second cover plate faces toward the second encapsulation layer.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "has," "having," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

In addition, when parts such as a layer, a film, a region, or a plate is referred to as being "on" another part, it may be "directly on" another part or may have another part present therebetween. In addition, when a part of a layer, film, region, plate, etc., is "directly on" another part, it means that no other part is positioned therebetween.

Although the present application is disclosed above with preferred embodiments, it is not used to limit the claims. The scope of protection shall be subject to the scope defined by the claims of the present application. In addition, the embodiments and the accompanying drawings in the specification of the present application are only illustrative examples, which will not limit the scope protected by the claims of the present application.

Those of ordinary skill in the art can understand that the above embodiments are specific examples for realizing the present application, and in actual disclosures, various changes may be made in shape and details without departing from the spirit and range of the present application. Therefore, the protection scope of the present application should be subject to the scope defined by the claims.

What is claimed is:

1. A tandem cell, comprising:
 a bottom cell, wherein the bottom cell comprises;
  a substrate, the substrate has a first side and a second side opposite to the first side, the first side has a first textured surface including at least one first protrusion structure, the second side has a textured surface including a plurality of protrusion structures, and the plurality of protrusion structures have a same dimension as that of the at least one first protrusion structure;
  a tunneling dielectric layer formed on the second side, the tunneling dielectric layer is conformal to the textured surface of the second side; and
  a doped conductive layer formed on the tunneling dielectric layer, wherein the doped conductive layer has a micro textured surface away from the tunneling dielectric layer, the micro textured surface comprises at least one micro protrusion structure, and the at least one micro protrusion structure is smaller than the at least one first protrusion structure;
 a composite layer formed on the doped conductive layer, wherein the composite layer is conformal to the micro textured surface; and
 a top cell formed on the composite layer, wherein the top cell comprises a first transport layer, a perovskite substrate having a first surface facing the bottom cell and an opposing second surface, a second transport layer, a transparent conductive layer, and an anti-reflection layer stacked sequentially, the first transport layer is between the composite layer and the perovskite substrate, and the first transport layer is conformal to the micro textured surface and the first surface of the perovskite substrate is conformal to the first transport layer.

2. The tandem cell according to claim 1, wherein a first side field is formed on the second surface of the perovskite substrate, and the first side field has a smaller roughness than the micro textured surface.

3. The tandem cell according to claim 2, wherein a second textured surface is formed on a surface of the transparent conductive layer away from the second transport layer, the second textured surface comprises at least one second protrusion structure, and the at least one second protrusion structure is larger than the at least one micro protrusion structure.

4. The tandem cell according to claim 3, wherein the second protrusion structure has a size of 100 nm to 10 μm.

5. The tandem cell according to claim 2, wherein the first side field comprises a flat surface.

6. The tandem cell according to claim 1, wherein the perovskite substrate, the second transport layer, the transparent conductive layer, and the anti-reflection layer are conformal to the micro textured surface, respectively.

7. The tandem cell according to claim 1, wherein the at least one micro protrusion structure has a size less than 1 μm.

8. The tandem cell according to claim 1, wherein the at least one micro protrusion structure has a pyramid shape, a sinusoidal curve shape, or a parabolic shape.

9. The tandem cell according to claim 1, wherein the composite layer comprises a transparent conductive oxide (TCO) layer, a thin metal layer, and a polymer conductive layer.

10. The tandem cell according to claim 1, wherein the first transport layer is one of an electron transport layer or a hole transport layer, and the second transport layer is the other of the electron transport layer or the hole transport layer.

11. A photovoltaic module, comprising:
 at least one cell string formed by connecting a plurality of tandem cells according to claim 1;
 at least one encapsulation layer configured to cover the at least one cell string;
 at least one cover plate configured to cover the at least one encapsulation layer.

* * * * *